United States Patent
Müller et al.

(10) Patent No.: US 7,964,275 B2
(45) Date of Patent: Jun. 21, 2011

(54) SILICON WAFER HAVING GOOD INTRINSIC GETTERABILITY AND METHOD FOR ITS PRODUCTION

(75) Inventors: Timo Müller, Burghausen (DE); Martin Weber, Kastl (DE); Gudrun Kissinger, Lebus (DE)

(73) Assignee: Siltronic AG, Munich (DE)

( * ) Notice: Subject to any disclaimer, the term of this patent is extended or adjusted under 35 U.S.C. 154(b) by 836 days.

(21) Appl. No.: 11/906,447

(22) Filed: Oct. 2, 2007

(65) Prior Publication Data

US 2008/0311342 A1    Dec. 18, 2008

(30) Foreign Application Priority Data

Oct. 4, 2006  (DE) .................. 10 2006 046 956
Jun. 13, 2007 (DE) .................. 10 2007 027 111

(51) Int. Cl.
G11B 11/105  (2006.01)
C30B 15/14   (2006.01)
C30B 15/00   (2006.01)
C01B 33/02   (2006.01)

(52) U.S. Cl. ............... 428/332; 117/3; 117/13; 423/348
(58) Field of Classification Search ............... 117/3, 13; 423/348; 428/332
See application file for complete search history.

(56) References Cited

U.S. PATENT DOCUMENTS

| | | | |
|---|---|---|---|
| 5,931,662 A | 8/1999 | Adachi et al. | |
| 5,980,720 A | 11/1999 | Park et al. | |
| 6,663,708 B1 | 12/2003 | Morita et al. | |
| 2004/0192015 A1 | 9/2004 | Ammon et al. | |
| 2006/0075957 A1 | 4/2006 | Takeno et al. | |
| 2006/0208434 A1* | 9/2006 | Nakada et al. | ................ 279/128 |
| 2006/0213424 A1 | 9/2006 | Müller et al. | |

FOREIGN PATENT DOCUMENTS

| | | |
|---|---|---|
| DE | 10047345 A1 | 5/2002 |
| DE | 10339792 A1 | 10/2004 |
| DE | 10 2005 013831 A1 | 9/2006 |
| WO | WO/93/10557 * | 5/1993 |

OTHER PUBLICATIONS

Müller et al: "Precipitation enhancement of "so called" defect-free Czochralski silicon material", Solid State Phenomena, vols. 108-109 (Dec. 2005), pp. 11-16.

(Continued)

*Primary Examiner* — Timothy M Speer
*Assistant Examiner* — Jonathan C Langman
(74) *Attorney, Agent, or Firm* — Brooks Kushman P.C.

(57) ABSTRACT

Silicon wafers in the entire volume of which crystal lattice vacancies are the prevalent point defect type, have a rotationally symmetric region whose width is at least 80% of the wafer radius, crystal lattice vacancy agglomerates of at least 30 nm in a density $\leq 6 \cdot 10^3$ cm$^{-3}$, crystal lattice vacancy agglomerates of from 10 nm to 30 nm in a density of $1 \cdot 10^5$ cm$^{-3}$ to $3 \cdot 10^7$ cm$^{-3}$, OSF seeds in a density of 0 to 10 cm$^{-2}$, and an average bulk BMD density of $5 \cdot 10^8$ cm$^{-3}$ to $5 \cdot 10^9$ cm$^{-3}$, which varies at most by a factor of 10 radially over the entire silicon wafer, and a BMD-free layer on the front side, wherein the first BMD is found at a depth of at least 5 μm and on average at a depth of at least 8 μm.

16 Claims, 11 Drawing Sheets

OTHER PUBLICATIONS

Sueoka et al.: "Oxygen precipitation behaviour and its optimum condition for internal gettering and mechanical strength in epitaxial and polished silicon wafers", Electrochemical Society Proceedings vol. 2000-17, p. 164, 2000.

R. Falster et al: "On the Properties of the Intrinsic Point Defects in Silicon: A Perspective from Crystal Growth and Wafer Processing", Phys. Status Solidi B, vol. 222, 2000, p. 219.

Hözl et al: "Influence of the silicide pattern density on the electron and hole mobility in the transistor channel", Electrochemical Society Proceedings vol. 2002-2, p. 602, 200.

G. Kissinger et al: "Cu precipitation in oxidized wafers with and without a GeXSi1—X heteroepitaxial layer", J. Mater. Res., vol. 8, No. 8 (1993), p. 1990.

V. V. Voronkov: "The mechanism of swirl defects formation in silicon", J. Crystal Growth, vol. 59, p. 625 (1982).

F. Quast, Dissertation: "Study of point defects in silicon with the aid of platinum diffusion", Erlanger Berichte Mikroelektronik, Editor: Prof. Dr.-ing. H. Ryssel, vol. 1/20, 2001.

* cited by examiner

Fig. 7
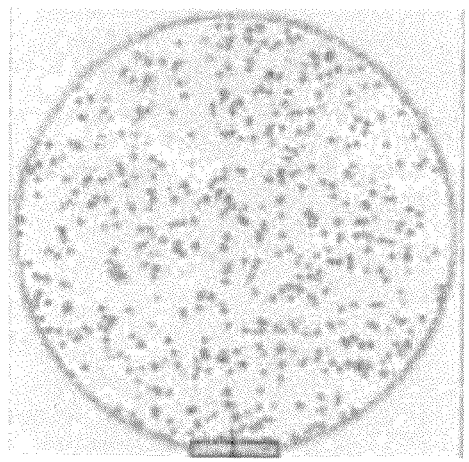
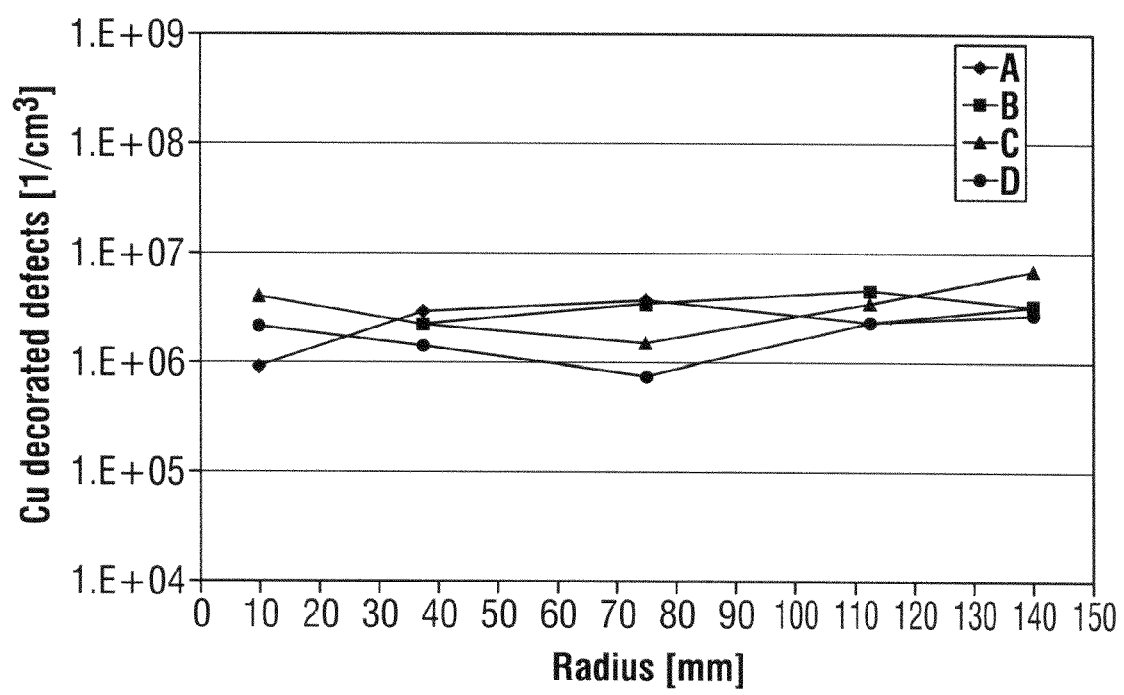

SILICON WAFER HAVING GOOD INTRINSIC GETTERABILITY AND METHOD FOR ITS PRODUCTION

BACKGROUND OF THE INVENTION

1. Field of the Invention

The present invention relates to a monocrystalline silicon wafer having good intrinsic getterability, the silicon wafer having a high BMD density in the bulk and a BMD-free layer on its surface. The invention also relates to a method for producing such silicon wafers by heat treatment.

2. Background Art

Silicon single crystals, which are generally produced according to the Czochralski crucible pulling method (CZ method), comprise a range of impurities and defects. The single crystals are sliced into wafers, subjected to a multiplicity of processing steps in order to obtain the desired surface quality and, finally, generally used for the production of electronic components. If special precautions are not taken, then the defects will also be found on the surface of the wafers where they can detrimentally affect the function of the electronic components fabricated thereon.

The following defect types generally occur in silicon wafers as a function of the conditions during production of the silicon single crystal, which are attributable to the presence of point defects i.e. crystal lattice vacancies or interstitial atoms. In the latter sense, interstitial silicon atoms are also referred to as interstitials.

Depending on the preparation or detection method, agglomerates of crystal lattice vacancies are referred to as "flow pattern defects" (FPDs), "gate oxide integrity (GOI) defects" or "crystal originated particles" (COPs). These COPs are octahedral cavities crystallographically perfectly oriented. Their inner wall is typically covered by a 1 to 4 nm thick oxide film which leads to thermal stabilization of the COP, so elimination of this defect by breaking down the oxide film and subsequently injecting interstitials is effectively possible only at temperatures of about 1200° C. and with process times of more than 30 minutes.

The COPs are exposed when sawing the silicon single crystal and subsequently etching and polishing the surface, and are encountered as depressions with a diameter of up to about 200 nm. These depressions lead to problems, for example short circuits on the so-called gate oxide of a CMOS transistor, since defective growth of this surface oxide takes place at this position. Vertical "trenches", which are produced by anisotropic etching and are part of a typical CMOS memory cell, may also be short circuited by a COP lying between them, or the protective oxide of the memory cell may be compromised. The dependency of the formation of COPs on the ratio v/G of the crystal pull parameters (v=crystal pull rate, G=thermal gradient at the interface between the melt and the growing single crystal) is described for example in V. Voronkov, J. CRYSTAL GROWTH, Vol. 59, p. 625 (1982).

At the interface between the melt and the growing single crystal, crystal lattice vacancies and interstitials are incorporated with an equilibrium concentration. When the crystal cools, recombination of the two point defect types ensures that a concentration higher than the equilibrium concentration (=supersaturation) does not occur either for the interstitials or for the vacancies. This applies so long as there is a significant concentration of interstitials. Thereafter, supersaturation of vacancies builds up. The concentration of vacancies is essentially determined by the parameter v/G (as described in J. CRYSTAL GROWTH, Vol. 59, p. 625 (1982)). In vacancy-rich crystals according to the prior art, aggregation of the vacancies to form COPs takes place after sufficiently high supersaturation is reached. Recent simulations of this COP aggregation show a rise in the COP density with small supersaturations. If the vacancy concentration after recombination is sufficiently small, however, then the aggregation would take place at a temperature significantly lower than 1100° C. With a theoretical aggregation temperature of less than 1000° C., however, the affinity of the vacancies for oxygen is greater than that of vacancies for other vacancies, the effect of which is that vacancies react with interstitial oxygen to form oxygen-vacancy complexes ($O_2V$). A high concentration of $O_2V$ is in turn highly conducive to the formation of seeds for oxygen precipitation. The defects thus formed can later be revealed as "oxidation induced stacking faults" (OSF) by subjecting the silicon wafers produced from the single crystal to an oxidation treatment. Those defects already existing before the oxidation treatment, which can be detected as OSFs, will be referred to below as OSF seeds.

Wafers with a high density of OSF seeds present the following disadvantages with respect to reduced component yields: (1) metals are preferentially bound to OSFs ("gettered"), which leads to degradation of the gate oxide due to enhanced formation of nucleation centers for volatile SiO; (2) OSF seeds grow in component-specific thermal processes to form large precipitates, which crucially weaken the silicon matrix due to formation of dislocation loops. This can lead to enhanced deformation ("warp") of the silicon wafer, which then in turn interferes with the photolithography step used in the CMOS process since the critical minimum structure linewidths are no longer achieved; (3) large oxygen precipitates, which are caused by OSF seeds, cannot generally be eliminated so as to form a BMD-free zone even by a thermal process, and thus they remain as defects in the active component zone. This, as already described for COPs, may lead to short circuits in the trench capacitor memory cell, or may weaken its capacitance.

In silicon single crystals, agglomerates of interstitials lead to dislocation loops with extents of several micrometers, which likewise has a detrimental effect on the function of the components produced there.

The prior art, however, contains ways of substantially avoiding the creation of these defects during crystal growth. It is known for instance that when accurately defined conditions are complied with during the crystal pull, neither agglomerates of crystal lattice vacancies nor agglomerates of interstitials occur. The above-described ratio v/G is of particular importance for this to occur.

Silicon wafers which are substantially free of agglomerates of crystal lattice vacancies and interstitials over the entire surface, generally comprise radial regions in which crystal lattice vacancies are the prevalent point defect type and other radial regions in which interstitials prevail, see for example DE10047345A1 or T. Müller et al., "Precipitation enhancement of so called defect-free Czochralski silicon material", SOLID STATE PHENOMENA, Vols. 108-109 (December 2005), pp. 11-16. In the latter regions, a subsequent heat treatment generally leads to the formation of only a low concentration of oxygen precipitates (also referred to as BMDs, "bulk micro-defects"). On the one hand this is desirable since oxygen precipitates on the wafer surface can lead to functional impairment or failure of the relevant components. On the other hand, however, oxygen precipitates bind metal impurities which diffuse into the silicon wafer during the production of electronic components. This effect is referred to as the "intrinsic getter effect", or "IG effect" for short. For this reason, the presence of oxygen precipitates in the interior of the silicon wafer (the "bulk") is generally desirable. Silicon wafers having regions in which crystal lattice vacancies prevail, and other regions in which interstitials prevail, have a very differently pronounced getterability in these regions owing to the different susceptibility to the formation of oxygen precipitates. For instance, the oxygen precipitates grow stress-free in zones with a vacancy excess by absorption of vacancies, which is not possible in zones with an excess of interstitials. More rapid growth is therefore possible in the vacancy-rich zones, and a mixture of zones with an excess of interstitials and zones with an excess of vacancies is generally undesirable on a wafer.

Another problem, however, occurs during the heat treatment of silicon wafers, in the entire volume of which crystal lattice vacancies are the prevalent point defect type and which at the same time are free of agglomerates of crystal lattice vacancies: If the interstitial oxygen concentration $[O_i]$ is selected to be high enough in order to ensure sufficient BMD formation and therefore sufficient getterability, then interfering OSF seeds are formed during the crystal growth when cooling. Furthermore, this effect also depends on the cooling rate of the crystal rod, since a longer residence time in the temperature zone relevant for the precipitate growth entails commensurately more formation of OSF seeds. If, however, the interstitial oxygen concentration $[O_i]$ is selected to be so low that no OSF seeds are formed during the growth of the crystal, then this leads to no BMD density or a low BMD density which is not enough to achieve a sufficiently large getter effect (for example defined with the aid of the size and density of the BMDs according to Sueoka et al., ELECTROCHEM. SOC. PV 2000-17, p. 164, 2000 or Hölzl et al., Electrochem. Soc. PV 2002-02, p. 602, 2002).

SUMMARY OF THE INVENTION

It was therefore an object of the invention to provide a silicon wafer which presents none of the aforementioned disadvantages. These and other objects are achieved by a silicon wafer, in the entire volume of which crystal lattice vacancies represent the prevalent point defect type, the silicon wafer having a region which is rotationally symmetric with respect to its axis and has a width of at least 80% of the radius of the silicon wafer, this region comprising agglomerates of crystal lattice vacancies with a size of at least 30 nm in a density of at most $6 \cdot 10^3$ cm$^{-3}$ and agglomerates of crystal lattice vacancies with a size of from 10 nm to 30 nm in a density of from $1 \cdot 10^5$ cm$^{-3}$ to $3 \cdot 10$ cm$^{-3}$, the silicon wafer comprising OSF seeds in a density of from 0 to 10 cm$^{-2}$ and an average BMD density in its interior of from $5 \cdot 10^8$ cm$^{-3}$ to $5 \cdot 10^9$ cm$^{-3}$, the BMD density varying at most by a factor of 10 in the radial direction over the entire radius of the silicon wafer, and wherein the silicon wafer comprises a BMD-free layer at least on the front side of the silicon wafer, which is distinguished in that the first BMD on the entire front side of the silicon wafer is found at a depth of at least 5 µm and the first BMD is found on average at a depth of at least 8 µm.

BRIEF DESCRIPTION OF THE DRAWINGS

FIG. 7: COP density measurement by means of copper decoration (bottom) of a wafer with a COP disk absent according to SC1/SP1 (top).

DETAILED DESCRIPTION OF THE PREFERRED EMBODIMENTS

Figure 1:
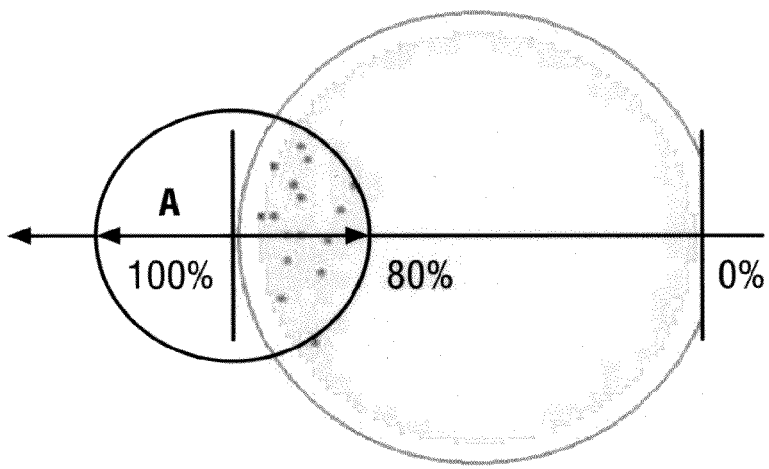
FIG. 1: Example of a silicon wafer according to the invention, having a centrally formed zone which comprises COPs with a diameter >30 nm (measurement method according to U.S. Pat. No. 5,980,720).

In this description, the term "COP disk" will be used as follows: a COP disk is a region at the center of the silicon wafer, which comprises agglomerates of crystal lattice vacancies with a size of at least 30 nm in a density of more than $6 \cdot 10^3$ cm$^{-3}$. The measurement of the COP density (FIG. 1) is carried out with the aid of a 150 mm wafer A, which is cut from a 300 mm wafer produced according to the invention so that the point indicated by 0% represents the original wafer edge and the point indicated by 100% is the original wafer center. The method described in U.S. Pat. No. 5,980,720 for detecting COPs was applied to the wafer bored out in this way. On all wafers produced according to the invention, detection of COPs is possible only in a central disk (=COP disk) with a radius <20% of the wafer radius.

The silicon wafer according to the invention comprises crystal lattice vacancies as the prevalent point defect type throughout its volume. The prevalent point defect type may, for example, be determined by platinum diffusion and subsequent µPCD measurement or by a BMD test.

In the first method, after immersion in hydrofluoric acid (HF), the silicon wafer is deliberately contaminated in an immersion bath with a 200 ppm platinum solution and the platinum is subsequently diffused into the wafer interior typically at 730° C. for 40 minutes. A so-called mirror etch is subsequently carried out, typically with 20 μm of erosion. The lifetime of the minority charge carriers, which differs significantly in the vacancy-rich and interstitial-rich zones (F. Quast, Dissertation: Untersuchung von Punktdefekten in Silicium mit Hilfe der Platindiffusion [Study of point defects in silicon with the aid of platinum diffusion], ERLANGER BERICHTE MIKROELEKTRONIK, Ed.: H. Ryssel, Vol. 1/2001, Shaker Verlag), is subsequently determined by means of the μPCD (microwave photoconductive decay) method, for example using a WT-85 Lifetime Scanner from Semilab. Since platinum preferentially diffuses via the so-called Frank-Thurnball mechanism, which requires vacancies for diffusion, enrichment with platinum takes place in the vacancy-rich zones. An increased platinum concentration in turn leads to a reduced lifetime of the minority charge carriers, which can be detected by μPCD.

In the second method, the BMD test, the domain structure is characterized with the aid of heat treatments. The detection is based on differently sized large seeds for oxygen precipitates being created owing to the differently high supersaturation and subsaturation of intrinsic defects (=vacancies=crystal lattice vacancies) during the crystal pull process. These in turn grow or shrink as a function of their size during prolonged heating in the scope of a heat treatment. The greater the supersaturation of intrinsic defects is at a radial wafer position, the greater is the density of the growing seeds which can be detected as BMDs with the aid of SIRM. In this way, the radial BMD profile allows statements to be made regarding the domain structure. To this end the silicon wafer is heated with a heating rate of 1 K/min from 900° C. to 1000° C. and subsequently kept at 1000° C. for two hours, before it is cooled rapidly to room temperature. The heat treatment takes place in an inert gas atmosphere. After the heat treatment, the radial BMD density is determined by means of SIRM every 2 mm from the center to the edge of the wafer at a depth of 50 μm.

A BMD test consisting of a heat treatment at 780° C. for 3 h and a subsequent heat treatment at 1000° C. for 16 h also fulfils the purpose of revealing the domain structure qualitatively via the size of the seeds grown, by determining the radial BMD density using SIRM every 2 mm from the center to the edge of the wafer at a depth of 50 μm.

In contrast to the teachings of the prior art, the silicon wafers according to the invention are not free of crystal lattice vacancies. It comprises a region, which is rotationally symmetric with respect to its axis and has a width of at least 80% of its radius, in which agglomerates of crystal lattice vacancies with a size of at least 30 mm occur in a density of at most $6·10^3$ $cm^{-3}$, when they have been studied by MO6 or the method described in U.S. Pat. No. 5,980,720. Both methods correlate well with respect to measured COP densities. For example, densities can be reached which lie below the current detection limit of $7·10^1$ $cm^{-2}$.

According to the invention, the density of the agglomerates of crystal lattice vacancies with a size of at least 30 nm is at most $6·10^3$ $cm^{-3}$ according to MO6 measurement (MO6 measuring instrument from Mitsui, Japan) and preferably 2.5 $cm^{-2}$ according Cu deposition/breakdown test. At the same time, agglomerates of crystal lattice vacancies with a size of from 10 to 30 nm are present in a high density of $1·10^5$ $cm^{-3}$ to $3·10^7$ $cm^{-3}$ in this region. These extremely small agglomerates of crystal lattice vacancies do not actually interfere with the smallest planned linewidths ("design rule") during the production of electronic components.

These small agglomerates are detected as follows: copper is deposited electrolytically from an aqueous $CuSO_4$ solution (20 g/l $CuSO_4$) containing HF (10 ml/l HF) on the backside of a silicon wafer or a piece of a silicon wafer, as described in G. Kissinger, G. Morgenstern, H. Richter, J. MATER. RES., Vol. 8, No. 8 (1993), p. 1900. The silicon wafer or the piece of wafer is then heat treated at a temperature in the range of 900-1000° C. for 5-20 minutes. The wafer or the piece of wafer is then subjected to a mirror etch ($HNO_3$: HF=5:1) for from 10 to 30 minutes, in order to erode a surface layer. The defects of the wafer are subsequently revealed by treatment with a Secco etching solution for 30 minutes.

The described rotationally symmetric region preferably begins on the edge of the silicon wafer and extends inward over at least 80% of its radius. It is particularly preferable for the rotationally symmetric region to cover the entire surface of the silicon wafer.

The silicon wafer according to the invention combines an extremely low density of OSF seeds with a high BMD density, which ensures sufficient getterability. For example, the silicon wafer according to the invention comprises an OSF density of from 0 to 10 per square centimeter averaged over the entire surface of the front side, preferably from 0 to 2 per square centimeter, and is therefore essentially free of OSF seeds. The OSFs are detected by optical microscopy after dry oxidation at 1000° C. for 3 hours, subsequent dry oxidation at 1150° C. for 100 minutes and preparation by a Wright etch. During the optical microscopy, a measurement area of 0.1 $cm^{-2}$ is evaluated every 5 mm from the center of the silicon wafer to the edge.

The silicon wafer is distinguished from the prior art by a BMD density of from $5·10^8$ $cm^{-3}$ to $5·10^9$ $cm^{-3}$, which is optimal for the subsequent production of electronic components. The BMD density is furthermore very homogeneous over the entire radius of the silicon wafer. The BMD density varies at most by a factor of 10 in the radial direction over the entire radius of the silicon wafer, preferably at most by a factor of 3, i.e. the ratio between the maximum and minimum BMD densities is at most 10, preferably at most 3. Nevertheless, it is possible to achieve even lower variations of the BMD density amounting to a factor of 2 or less. A sufficiently high, stable and homogeneous getterability is therefore achieved over the entire silicon wafer. The silicon wafer according to the invention thus fulfils the criterion of the so-called getter test and exhibits a stable BMD density with BMDs of sufficient size, which are not eliminated by any thermal process typically used in the scope of the component production.

The BMD density is determined for example by means of cleaving, partially etching the cleaved surface, and counting the defects amplified by the etching attack by means of optical microscopy. Typical etchants are Wright, Secco and Yang etching solutions, typical etching erosions lying in the range of 1 μm. A typical assessment count for determining the BMD density involves recording five equidistant points along the radius. In order to achieve a high resolution of the BMD density radially, an automatic SIRM-based BMD counter based from Semilab is supplementarily used. To this end a laser beam focused typically at a depth of 50 μm from the wafer surface is moved from the wafer center to the edge and the light scattered by BMDs is determined in a confocal arrangement using a photodiode. By scanning an area typically of 100×100 μm² at intervals of two millimeters along the wafer radius, the radial BMD density is determined with a sufficiently high lateral resolution. Since both methods have a detection limit of about 70 nm with respect to the BMD size, a thermal growth step is used (typically 1000° C. for 16 hours) in order to raise the BMD size distribution many times above the detection limit of the method. All BMD densities indicated in this description and in the patent claims are BMD densities which are determined after carrying out this growth step.

At more than 5 µm, the BMD-free layer on the front side of the silicon wafer is so deep that it generally covers the entire thickness of the layer in which the electronic components will subsequently be structured. The BMD-free layer is in turn studied by analyzing the fracture edge by means of optical microscopy, and specifically in the same working step as that in which the BMD density is determined. It is possible for an experienced operator to determine a BMD-free layer with a vertical resolution of 1 µm. The BMD-free layer at a given position is defined by the distance from the first measured BMD to an arbitrary point in a lateral analysis window with a length of 4 mm. The thickness of the BMD-free layer is typically determined every 20 mm along the wafer diameter for these studies. Important quantities for the statistical assessment of the thickness of the BMD-free layer of a silicon wafer are the average thickness (averaged over all measurement results of the silicon wafer) and the minimum thickness from all measurement results of a silicon wafer. The first BMD on the entire front side of the silicon wafer is found at a depth of at least 5 µm according to the invention, i.e. the minimum thickness of the BMD-free layer is at least 5 µm. The average thickness of the BMD-free layer is at least 8 µm according to the invention. Even larger thicknesses of the BMD-free layer can nevertheless also be achieved. The average thickness of the BMD-free layer may extend up to 12 µm or more.

The silicon wafer is preferably not doped with nitrogen, since doping with nitrogen stimulates oxygen precipitation by buffering vacancies in nitrogen-vacancy complexes ($N_2V$) and releasing them at lower temperatures of the single crystal, and it therefore also suppresses COP formation. This increased precipitation of oxygen furthermore leads to enhanced OSF formation as well as to broadening of the OSF ring.

The total length of the slips existing in the silicon wafer is preferably at most 3 cm.

Silicon wafers according to the invention may be produced by a method which comprises the following steps:
preparing a silicon wafer having an interstitial oxygen concentration $[O_i]$ in the range of from $4.5 \cdot 10^{17}$ cm$^{-3}$ to $5.8 \cdot 10^{17}$ cm$^{-3}$, in the entire volume of which crystal lattice vacancies represent the prevalent point defect type, the silicon wafer having a region which is rotationally symmetric with respect to its axis and has a width of at least 80% of the radius of the silicon wafer, this region comprising agglomerates of crystal lattice vacancies with a size of at least 30 nm in a density of at most $6 \cdot 10^3$ cm$^{-3}$ and agglomerates of crystal lattice vacancies with a size of from 10 nm to 30 nm in a density of from $1 \cdot 10^5$ cm$^{-3}$ to $3 \cdot 10^7$ cm$^{-3}$,
heat treating the silicon wafer in an inert or reducing atmosphere, the silicon wafer being heated starting from a loading temperature of from 350° C. to 750° C. with a heating rate of 0.5 K/min to 8 K/min to a temperature of 1000° C., and further with a heating rate of from 0.1 K/min to 4 K/min until a holding temperature in the range of from 1025° C. to 1175° C. is reached, subsequently kept at the holding temperature for a duration of from 1 hour to 4 hours, and then cooled with a predetermined cooling rate to an unloading temperature.

In order to produce the silicon wafers according to the invention, silicon wafers with defined properties are first prepared and these are then subjected to a heat treatment.

One essential parameter is the interstitial oxygen concentration $[O_i]$, which lies in the range of from $4.5 \cdot 10^{17}$ cm$^{-3}$ to $5.8 \cdot 10^{17}$ cm$^{-3}$. (All indications of concentrations of interstitial oxygen in this description and in the patent claims refer to "New ASTM"). The silicon wafer is preferably not doped with nitrogen. The silicon wafer preferably has a low dopant concentration with a resistivity in the range of from 1 Ωcm to 100 Ωcm.

The silicon wafer may comprise crystal lattice vacancies as the prevalent point defect type in its entire volume. This avoids the problems explained in the introduction regarding inhomogeneous oxygen precipitation during the subsequent heat treatment.

The concentration and size distribution of the agglomerates of crystal lattice vacancies scarcely change during the subsequent heat treatment. Before and after the heat treatment, the same methods may respectively be used in order to determine the concentration and sizes.

In contrast to the teaching of the prior art, the silicon wafer is not free of agglomerated crystal lattice vacancies. It comprises a region which is rotationally symmetric with respect to its axis and has a width of at least 80% of the radius of the silicon wafer, in which agglomerates of crystal lattice vacancies with a size of at least 30 nm occur in a density of at most $6 \cdot 10^3$ cm$^{-3}$. These comparatively large agglomerates thus occur only in a low concentration. The most sensitive measurement mode is employed in this case. This means that a laser beam in the red spectral range is used, which leads to a penetration depth of 5 µm and the data acquisition is carried out in the so-called "LOW throughput mode". The detection limit is dependent on the wafer surface being studied.

At the same time, agglomerates of crystal lattice vacancies with a size of from 10 nm to 30 nm are present in this region in a high density of from $1 \cdot 10^5$ cm$^{-3}$ to $3 \cdot 10^7$ cm$^{-3}$. These extremely small agglomerates of crystal lattice vacancies do not interfere even with the smallest planned linewidths ("design rule") during the production of electronic components. At the same time, their presence has a substantial positive effect which the invention utilizes: during the crystal pull, they greatly reduce the concentration of free crystal lattice vacancies. This significantly lowers the temperature at which the oxygen precipitation takes place when cooling during the crystal pull process. The effect of this is in turn to restrict the size of the oxygen precipitates created when cooling, which, together with the comparatively low selected interstitial oxygen concentration $[O_i]$, means that the formation of OSF seeds is very substantially avoided when cooling.

The described rotationally symmetric region preferably begins at the edge of the silicon wafer and extends inward over at least 80% of its radius. It is particularly preferable for the rotationally symmetric region to cover the entire surface of the silicon wafer.

Figure 5:
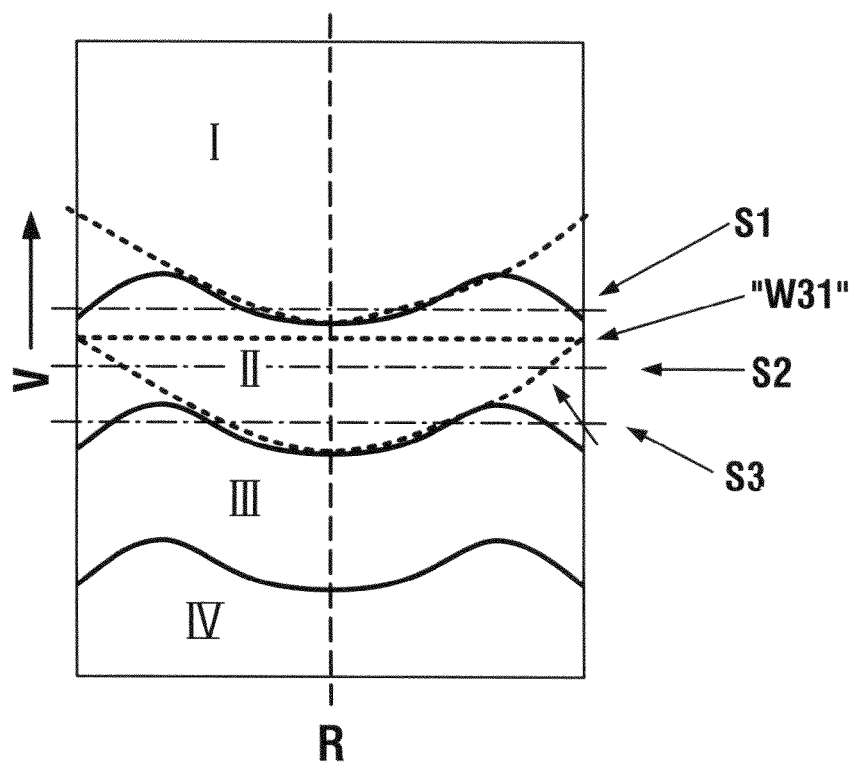
FIG. 5: Comparison of the interstitial- and vacancy-dominated regions from a silicon wafer according to the invention with "W31" according to DE10047345A1 and comparison of the radial profile of v/G with (solid lines) and without (dashed lines) using a ring heater.

The described silicon wafer, which is subsequently subjected to heat treatment, may be obtained by a suitable crystal pulling process according to Czochralski. FIG. 5 schematically shows the sequence of different domains as a function of the radial position R, i.e. the distance from the rotation axis 1 of the single crystal, as a function of the pull rate v. With a low pull rate the region IV is occupied, which is distinguished by the occurrence of agglomerated interstitials. Agglomerates of interstitials are also referred to as LPITs. If the pull rate is increased, then transition takes place to the region III in which interstitials still represent the prevalent point defect type, but without forming agglomerates. When further increasing the pull rate v, the transition first takes place to region II in which vacancies represent the prevalent point defect type, vacancy agglomerates with a size of 30 nm or more occurring merely in a density of $6 \cdot 10^3$ cm$^{-3}$, followed by the transition to region I where the agglomeration of the vacancies increases and the density of the vacancy agglomerates with a size of 30 nm or more exceeds the value of $6 \cdot 10^3$ cm$^{-3}$.

The described silicon wafers, which are subsequently subjected to heat treatment, are obtained from a corresponding crystal which has for example been produced according to DE10339792A1 by Czochralski crystal pulling, particular conditions being preferred with respect to the crucible and crystal rotations, the magnetic field and the ring heater. By rotation of the crucible and the crystal in the same sense (co-rotation) in conjunction with a rotationally symmetric magnetic field with respect to the rotation axis of the crystal 1 (CUSP field) which is generated by oppositely poled coils facing one another, it is possible to influence the conduction in the melt so as to create a heat flux directed toward the center of the growth front. The radial v/G profile therefore changes, since the axial thermal gradient G is increased at the center of the growth front. v/G is reduced in this region. The neutral line, at which the axial component of the magnetic field takes the value zero, preferably lies above the surface of the melt. The crucible and the crystal are preferably co-rotated at a rate of from 2.5 to 4 rpm and from 6 to 12 rpm, respectively. By using a ring heater in the vicinity of the edge of the growing crystal, the axial thermal gradient is reduced in the region of the edge of the growth front and v/G is therefore increased in this region. Co-rotation of the crucible and the crystal in combination with the use of a ring heater, which supplies radiative heat from the outside, leads to a v/G profile which is only a little higher at the center of the growth front than at the edge of the growth front. In FIG. 5, the solid lines at the boundaries of the various regions represent the v/G profile with this modified crystal pull process. The dashed boundaries represent the profile according to the prior art. The power of the ring heater is preferably from 8 to 12 kW, more preferably from 8 to 10 kW.

Figure 10:
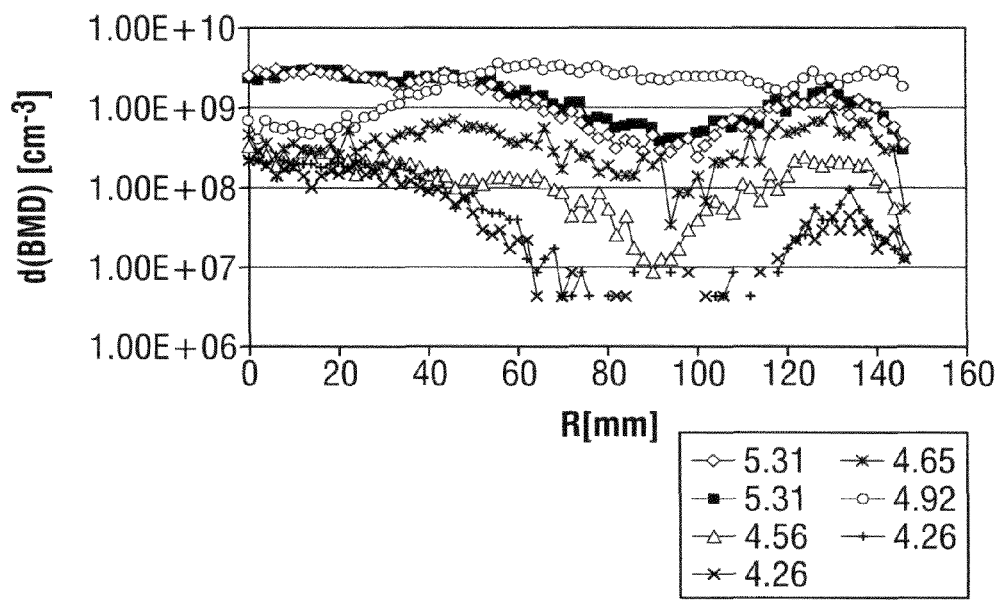
FIG. 10: Radial BMD density with various interstitial oxygen concentrations.

By controlling the axial profile of the intrinsic oxygen concentration, the concentration can be kept below the critical value for the OSF nucleation of $5.8 \cdot 10^{17}$ cm$^{-3}$, preferably $5.5 \cdot 10^{17}$ cm$^{-3}$, over the entire rod. Above this critical value, the OSF density according to the OSF test described above increases to 100/cm$^2$ or more. In order to achieve the greatest possible yield of wafers with a high BMD density and a radially homogeneous profile from a single crystal by the thermal process according to the invention, the crystal pull process is adjusted so that as many wafers as possible have an intrinsic oxygen concentration of at least $4.5 \cdot 10^{17}$ cm$^{-3}$ (see FIG. 10). The oxygen concentration is kept in the intended range by controlling the pressure in the pulling system so that it lies in a range of from 5 to 20 mbar, preferably from 10 to 15 mbar, and by controlling the flow of argon through the pulling system so that it lies in a range of from 2000 to 4500 l/h, preferably from 2800 to 3200 l/h.

The co-rotation is adapted to the central heat flux in the silicon melt so that the radial profile of v/G comprises the greatest vacancy supersaturation in the central region and therefore leads to a COP zone with larger COP diameters than in the surrounding edge region. As can be seen from FIG. 5, this measure leads to a significantly higher yield of type S2 wafers, which lies entirely inside the vacancy-rich region II.

The single crystal is sliced into wafers according to the prior art and preferably subjected to a plurality of planarizing and smoothing treatment steps according to the prior art, for example lapping or grinding, etching and polishing. A silicon wafer obtained in this way with the described properties is now subjected to the heat treatment according to the invention in an inert or reducing atmosphere.

A multiplicity of the silicon wafers obtained in this way with the described properties are preferably subjected simultaneously to heat treatment under an inert or reducing atmosphere in a batch oven. A batch oven is a device in which a multiplicity of silicon wafers are arranged mutually parallel with a defined spacing from one another and are heat treated simultaneously. There are horizontal and vertical ovens; the use of a vertical oven being preferred in the context of the invention. The silicon wafers in the vertical oven are mounted in a holding device, the so-called "boat", each silicon wafer resting individually on a support, the substrate holder. During heat treatment, the boat lies in a usually cylindrical process chamber which is heated from the lateral surface.

The heat treatment is carried out in an inert or reducing atmosphere. A preferred reducing atmosphere contains hydrogen. Besides one or more reducing gases, a reducing atmosphere may also contain inert constituents. An inert atmosphere only contains constituents which do not react with the surface of the silicon wafer under the conditions of the heat treatment, i.e. at a temperature of at most 1200° C. Inert gases such as nitrogen or noble gases may for example be used, noble gases being preferred and argon particularly preferred.

The silicon wafers are loaded into the batch oven at a loading temperature of from 350° C. to 750° C. and subsequently heated with a heating rate of 0.5 K/min to 8 K/min, preferably with a heating rate of 0.5 K/min to 5 K/min, to a temperature of 1000° C. It has been found that these heating rates lead to a sufficiently high density of stable oxygen precipitates, despite the low oxygen content of the silicon wafers.

Figure 11:
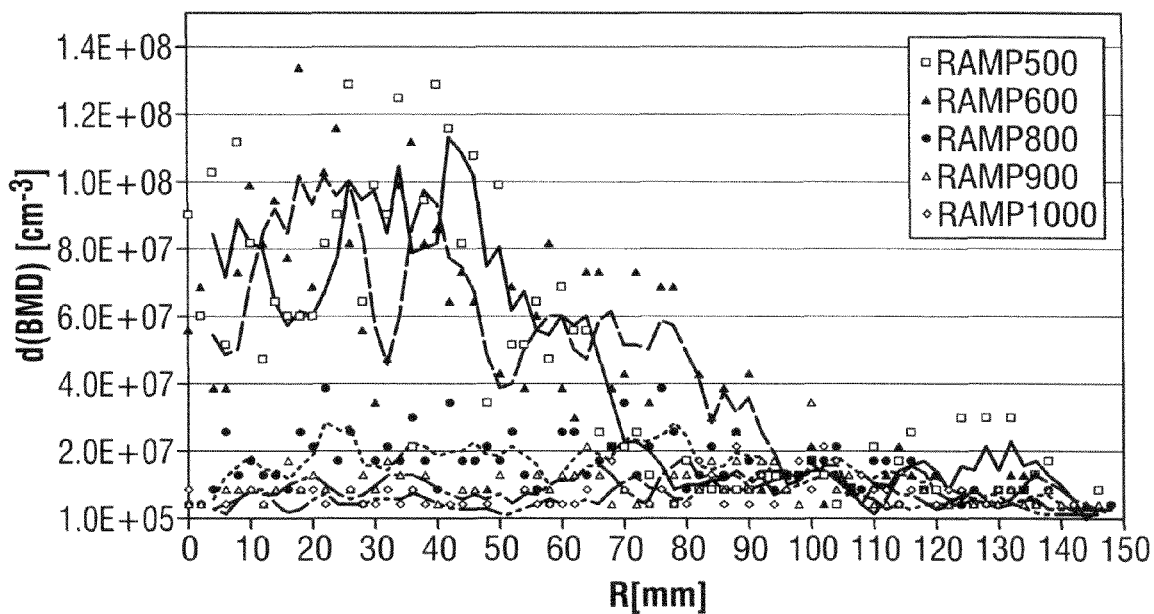
FIG. 11: Effect of different heating rates during heat treatment on the BMD density of a first silicon single crystal.
Figure 12:
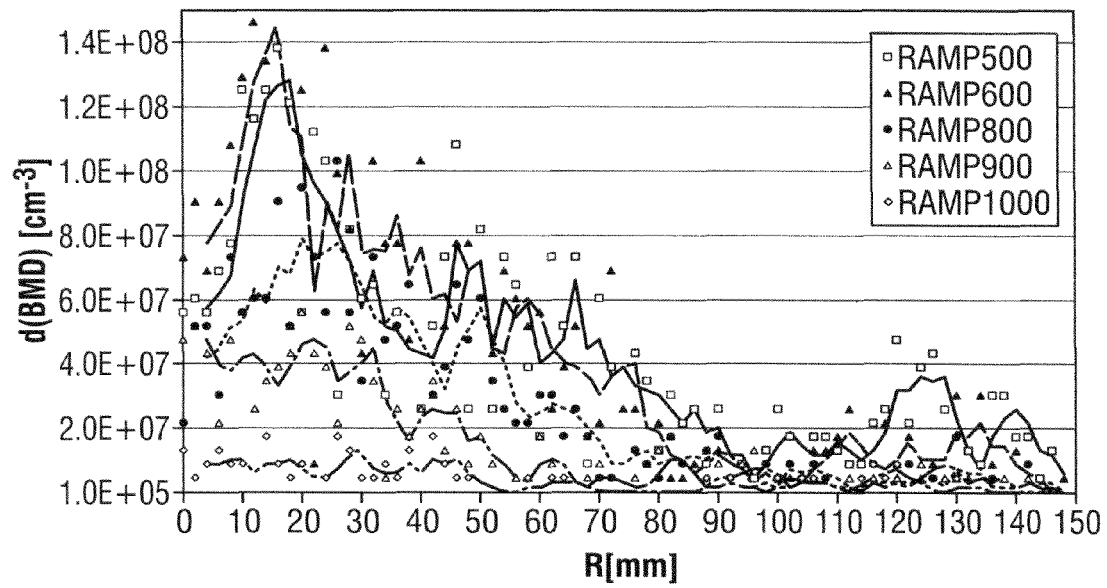
FIG. 12: Effect of different heating rates during the heat treatment on the BMD density of a second silicon single crystal.

By means of a so-called ramp rate anneal, the size/density spectrum of the BMD seeds grown was studied for the described material. To this end heating rates of 1 K/min were implemented in a vertical oven with different loading temperatures and a fixed final holding temperature (FIGS. 11, 12 for two different silicon single crystals): 500-1000° C. ("RAMP500"), 600-1000° C. ("RAMP600"), 700-1000° C. ("RAMP700"), 800-1000° C. ("RAMP800"), 900-1000° C. ("RAMP900"), 1000° C. ("RAMP1000"). The BMD seeds, which are still stable at the respective loading temperature and whose size lies above the critical size up to which the BMD seeds would be eliminated, are thereby respectively made to grow. By analyzing these diagrams, it is possible to establish the way in which the actual profile of the heating rates must be configured in the scope of the heat treatment, in order to make enough grown-in BMD seeds grow so that a relatively high process temperature of 1050-1100° C., which is required for production of the BMD-free layer, does not quench too many BMD seeds, so that a sufficient BMD concentration is available after the heat treatment.

The silicon wafers are heated further with a heating rate of from 0.1 K/min to 4 K/min until a holding temperature in the range of from 1025° C. to 1175° C. is reached, preferably in the range of from 1025° C. to 1125° C., and more preferably in the range of from 1050° C. to 1100° C.

The silicon wafers are subsequently kept at the holding temperature for a duration of from 1 hour to 4 hours, preferably for a duration of from 2 to 3 hours.

Figure 13:
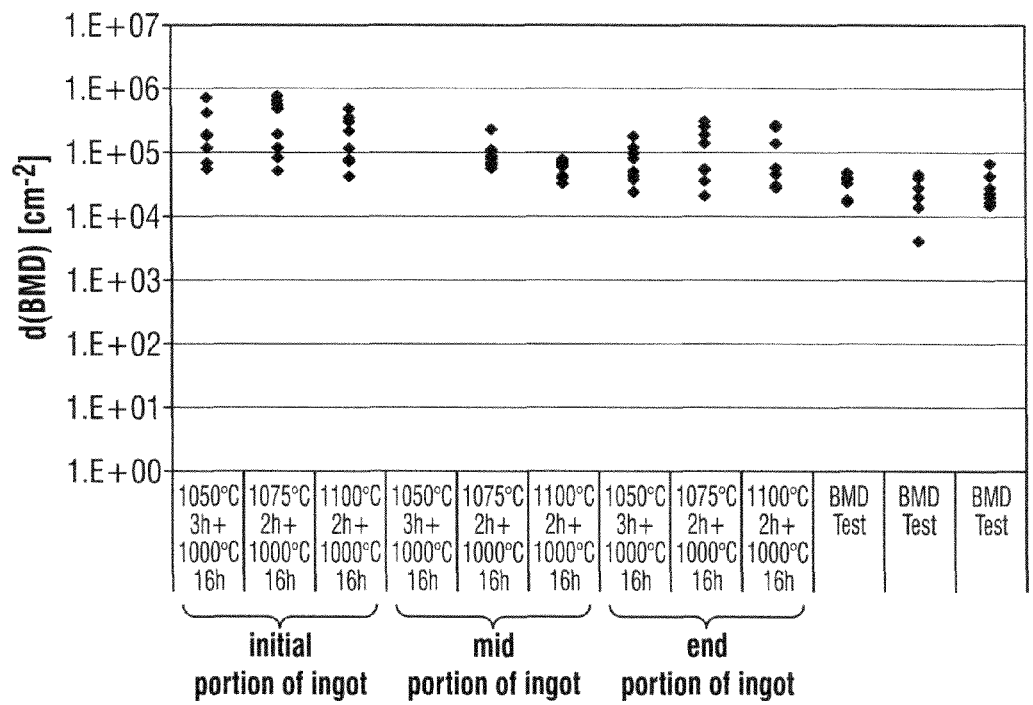
FIG. 13: BMD densities of silicon wafers which have been subjected to various heat treatments according to the invention.

Holding temperatures of 1100° C. and times of 2 hours typically lead to a depth of the BMD-free layer in excess of 10 μm. Holding temperatures of 1050-1075° C. and holding times of 2-3 hours typically lead to a depth of the BMD-free layer in excess of 5 μm. The BMD density in the bulk, however, does not vary significantly with the level of the holding temperature or the holding time. The method according to the invention is therefore robust with respect to wafers from different rod positions, or process variations. FIG. 13 shows the BMD density d(BMD) for various holding temperatures and times for wafers from the start, the middle and the end of a single crystal. The three measurement values on the right, denoted by "BMD test", relate to silicon wafers not according to the invention which were not subjected to a heat treatment before the BMD test. The measurement values respectively lying above one another in a column reflect the BMD densities at various radial positions of the silicon wafers, and therefore the radial variation in the BMD density.

The silicon wafers are then cooled with a predetermined cooling rate to an unloading temperature of preferably 450-650° C. and removed from the oven. The cooling rates preferably correspond to the heating rates indicated for the various temperature ranges.

Owing to the low oxygen content according to the invention and the preferred low dopant content, the silicon wafers which are subjected to heat treatment are very soft and susceptible to the occurrence of slips during heat treatment. Slips reduce the yield during the production of electronic components since, for example, metal impurities accumulate preferentially on these crystal defects. The heat treatment according to the invention is therefore preferably carried out so that the total length of the slips existing in the silicon wafer does not exceed 1 cm. The slips are detected by means of elastic stress field measurement (SIRD) of the elastic stress field associated with each slip or with each slip region (manufacturer for example Jenawave, Jena, Germany). In order to avoid the creation of slips, wafer supports made of silicon or silicon carbide are preferably used for mounting the silicon wafers in the vertical oven, as described in DE102005013831.

The silicon wafers according to the invention preferably do not experience any further heat treatment other than the heat treatment just described, before they are used for producing electronic components. The described method thus allows comparatively cost-effective production of the silicon wafers according to the invention.

COP Sizes: Comparison of an MO6 and Cu decoration measurement

Figure 2:
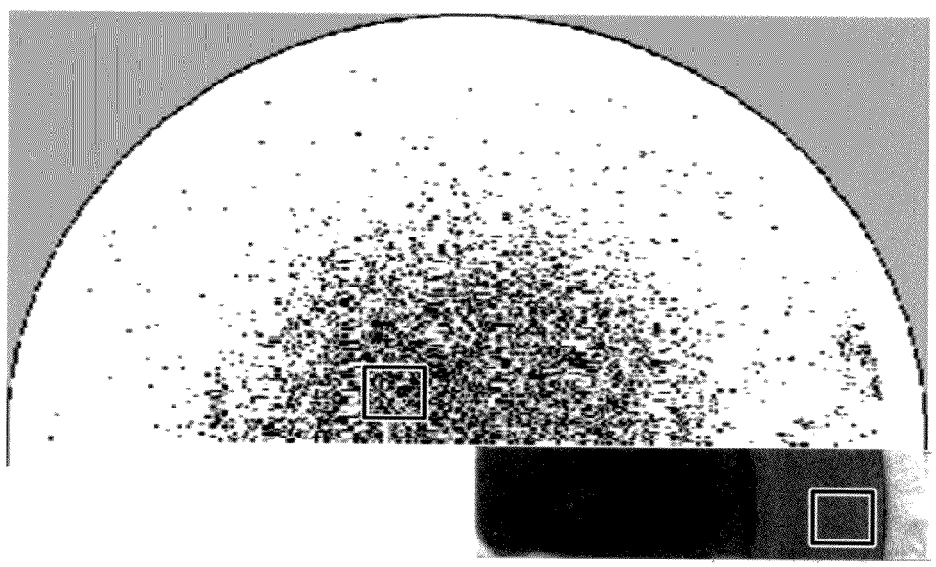
FIG. 2: Radial distribution of COP defects with diameters respectively greater and less than 30 nm with the aid of a simultaneous MO6 (top) and copper decoration technique (bottom).

FIG. 2 depicts a 300 mm wafer not according to the invention, which comprises a COP disk according to MO6 measurement with a radius >20% of the wafer radius. A Cu decoration measurement was carried out on the two wafer halves. The measurement shows a significantly higher defect density in the circular zone adjoining the COP disk. These are COPs with a diameter which is so small that they were not detectable by MO6 measurement or by means of the method described in U.S. Pat. No. 5,980,720.

Figure 3:
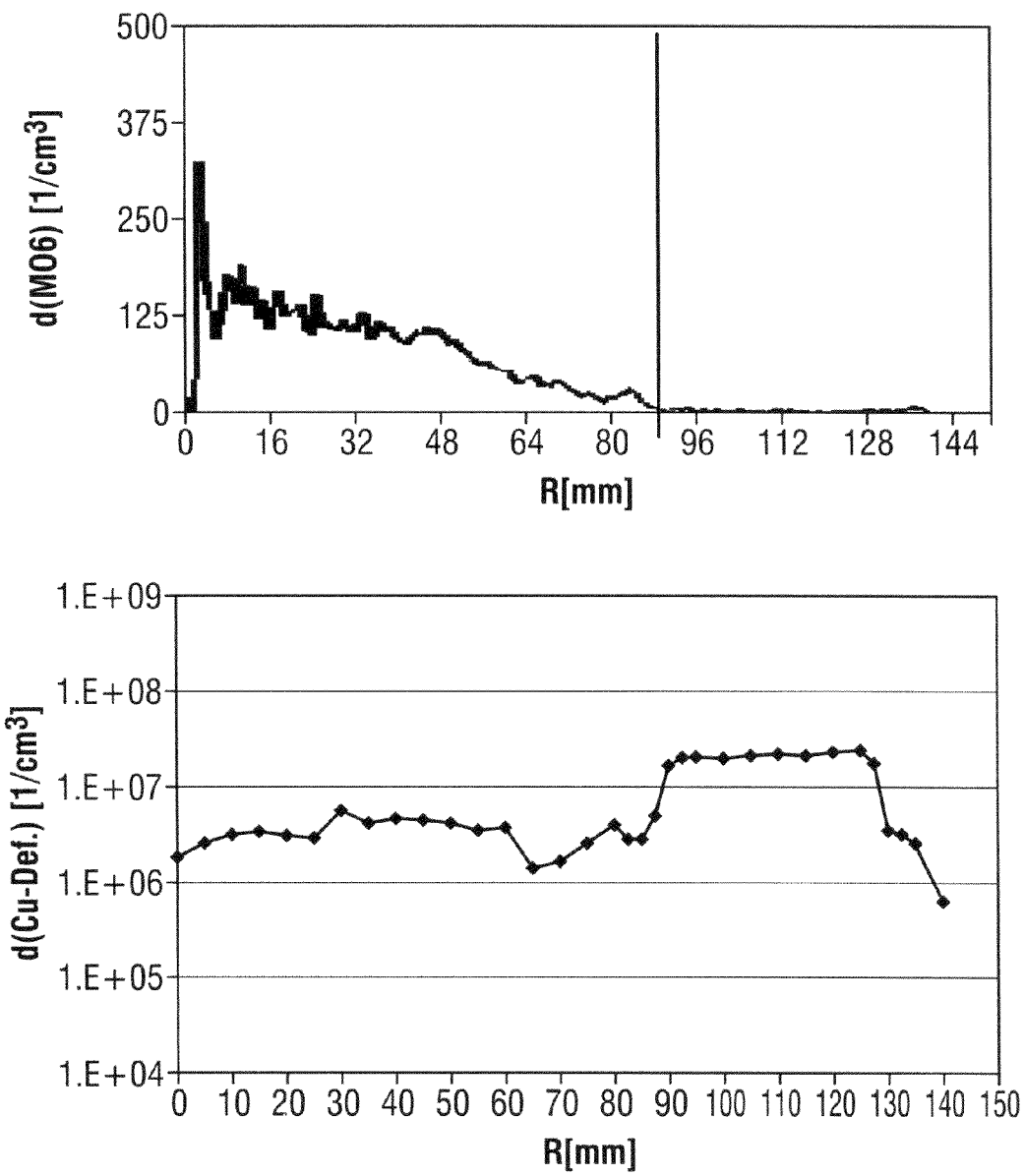
FIG. 3: Comparison of the radial COP density distribution, measured by the MO6 (top) and copper decoration technique (bottom).
Figure 4:
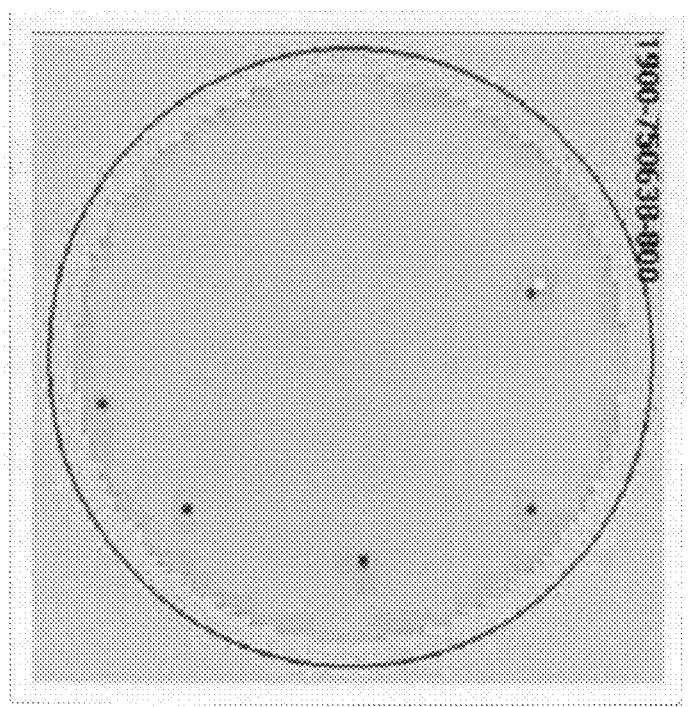
FIG. 4: Silicon wafer according to the invention with no COP disk as indicated by surface analysis according to U.S. Pat. No. 5,980,720.

The associated radial scan is represented in FIG. 3, top, and shows a constant reduction in the detected COP density d(MO6) down to zero (at a radial position R~90 mm from the wafer center). The radial scan according to Cu decoration measurement, on the other hand, shows a relatively constant density d(Cu-def.) of from $10^6$ to $10^7$ cm$^{-3}$. This shows that the COP size continuously decreases radially, but the densities still remain high. COP sizes below the detection limit of MO6, which is about 30 nm, are no longer detected by this method. In the subsequent zone up to about 130 mm from the center an even higher density of Cu decoration defects occurs (about $3 \cdot 10^7$ cm$^{-3}$), which represents a zone with COP sizes below the resolution limit of MO6. The decrease at the edge toward lower defect densities is attributable to the influence of the modified heat flux, which raises the vacancy supersaturation at the edge and therefore increases the COP diameter in this zone. A COP density similar to the 80-90 mm radial zone is formed. (MO6 has an edge exclusion of 5 mm due to the measuring technique.)

Figure 16:
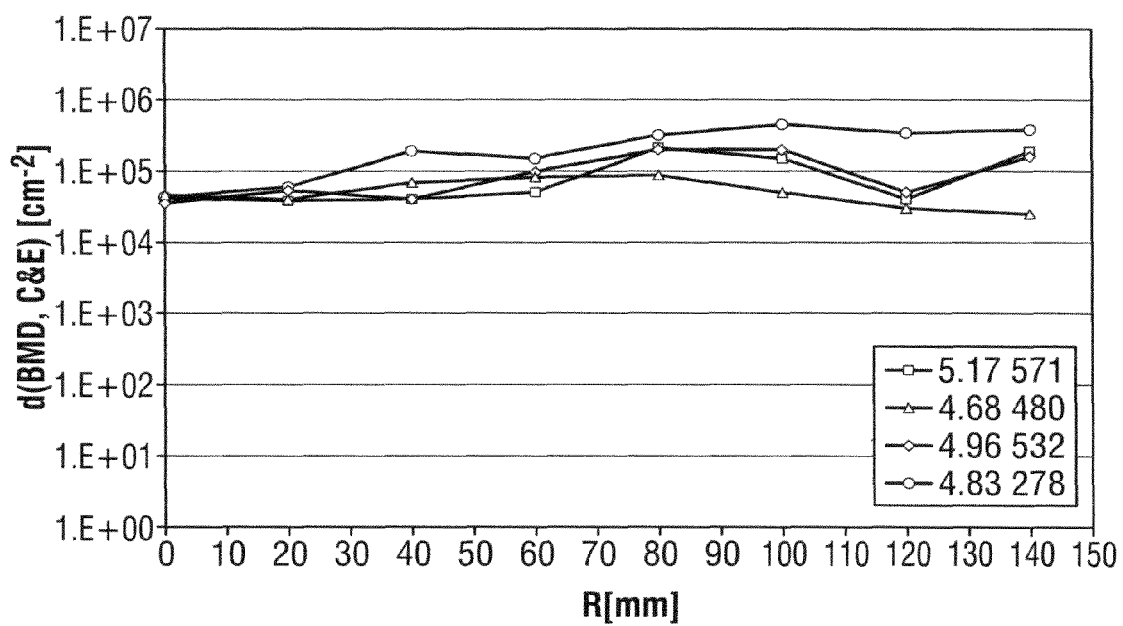
FIG. 16: Radial distribution of the BMD density, determined by fracture, etching and optical microscopy, for four silicon wafers according to the invention.

Comparison of a so-called "Pv" wafer according to the prior art with a wafer having no COP disk and produced according to the pulling method by means of a ring heater:

DE10047345A1 (FIG. 16) describes a wafer (W31) which lies completely in a vacancy-rich region. For comparison, FIG. 5 represents the various vacancy- and interstitial-dominated domains (solid lines) of a single crystal pulled according to the invention and its counterpart wafer "W31" according to DE10047345A1 (dashed lines) from its FIG. 16, in a diagram with increasing pull rate v. The dashed line 1 represents the longitudinal axis of the single crystal. Differences occur beyond radius >50% because the use of the ring heater displaces the v/G boundary and this leads to a bend of the neutral zone (concentration of the vacancies and interstitial point defects equal at each radial position). In the v/G diagram described in DE10047345A1, the W31 wafer comprises significantly higher vacancy supersaturation at the center than at the wafer edge, since the wafer edge lies in the vicinity of the neutral zone (FIG. 16). The wafer center, however, would comprise a significantly higher vacancy concentration since it lies immediately next to the OSF band. The most sensitive available COP measurement method is used in order to detect possible COPs on the W31 wafer: a wafer etched by means of a cleaning solution containing ammonia (so-called SC1 solution) is studied using a particle counter (for example Sp1 from KLA-Tencor, USA) for etch pits which are due to COPs being etched.

Figure 6:
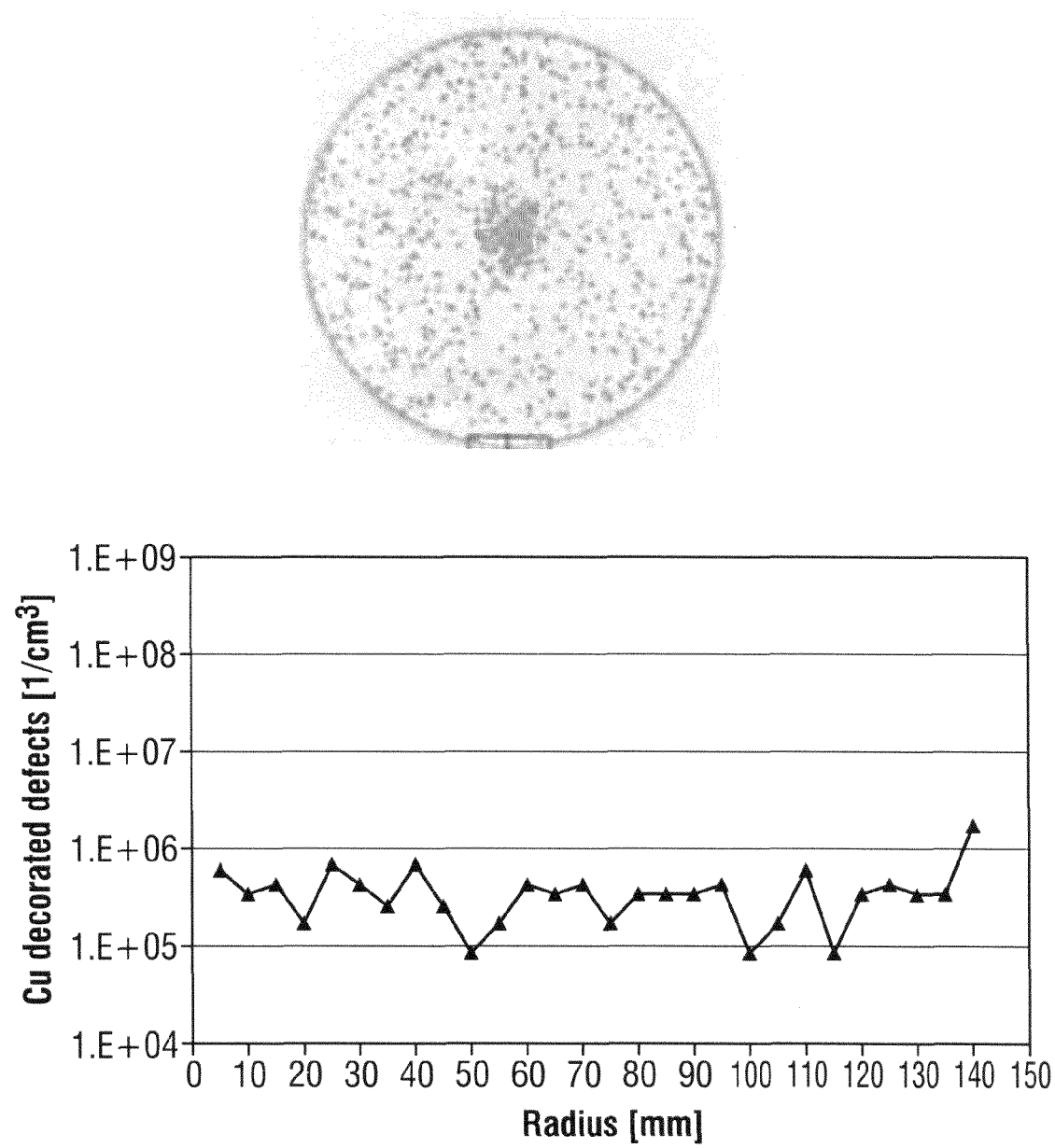
FIG. 6: COP density measurement by means of copper decoration (bottom) of a wafer with a COP disk visible according to SC1/SP1 (top).

A silicon wafer (FIG. 6), which was produced by the pulling method according to the invention, still shows a very small COP disk with this method and therefore lies close to the transition at the rod center in FIG. 16 of DE10047345A1 to the so-called COP-free "Pv" zone. The COP density measured by means of the copper decoration technique is from $10^5$ to $10^6$ cm$^{-3}$ and is radially distributed homogeneously over the silicon wafer. In comparison with this, wafers without a measurable COP disk (FIG. 7) which were pulled close to the boundary between the interstitial- and vacancy-rich regions, have a higher but essentially homogeneous COP density of from $10^6$ to $10^7$ cm$^{-3}$ measured by copper decoration. This would correspond in FIG. 16 of DE10047345A1 to the zone with a vacancy concentration similar to the wafer edge.

A "W31" silicon wafer according to DE10047345A1, on the other hand, has a significant radial variation in the COP density—detected by means of copper decoration—in the range of two orders of magnitude, which extends from about $5 \cdot 10^5$ cm$^{-3}$ at the center of the wafer to $5 \cdot 10^7$ cm$^{-3}$ at the wafer edge.

Categorization of the Cu Decoration Defects as COPs

So-called FZ silicon (silicon produced by the "float zone" method) differs from CZ silicon in that the oxygen concentration is reduced by at least two orders of magnitude. BMD or OSF formation therefore never occurs in FZ silicon. The FZ material used here differs from conventional FZ material by the lack of nitrogen co-doping. COP formation occurs in the vacancy-rich zone, and LPIT formation in the interstitial-rich zone is likewise known.

Figure 9:
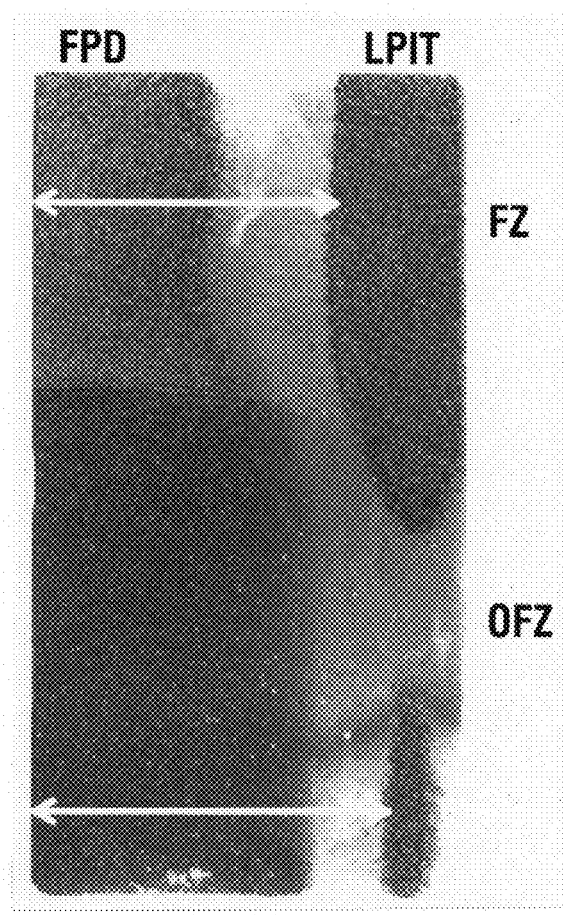
FIG. 9: Comparison of the Cu decoration defects on FZ silicon (FZ) doped with oxygen (OFZ) and not doped with oxygen.

A so-called plank (produced by cutting a single crystal parallel to the crystal axis) from an FZ crystal with a diameter of 150 mm, which was pulled so that COPs were established by means of FPD along the radius in the central zone and LPITs in the edge region, was studied in FIG. 9. Oxygen doping in the range of $10^{17}$ cm$^{-3}$ was furthermore achieved during the pull process by means of an applied quartz ring. The quartz ring's surface coming in contact with the molten silicon region dissolves and dopes the growing FZ single crystal rod with oxygen (FIG. 9: OFZ). This can be seen by the different radial profile of the V/I boundary in the lower part of the plank.

Distinction is to be made between two defect types in the oxygen-free zone (FIG. 9: FZ) of the FZ crystal, both of which can be detected by means of Cu decoration and which are attributable to COPs as the sole possible defect type. In the zone with high contrast near the transition to the LPIT zone, only one defect type occurs with low decoration contrast. No small Cu decoration defects occur in the inner zone having COPs with larger diameters, but instead only larger Cu decoration defects. This defect type corresponds to the COP defects already determined above by means of the FPD method. In the zone doped with oxygen (OFZ), qualitatively the same profile is to be seen.

Figure 8:
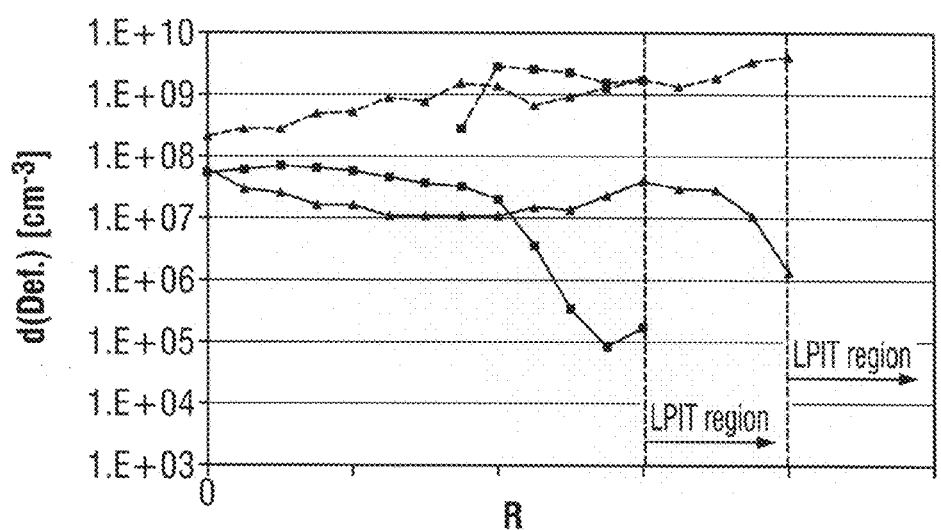
FIG. 8: Comparison of the Cu decoration defects on FZ silicon (FZ) doped with oxygen (OFZ) and not doped with oxygen.

The dependency of the density d(Def.) of the various defects on the radius R is represented in FIG. 8. The solid line with the squares reflects the density of the large defects, and the dashed line with the squares the density of the small defects, respectively in the oxygen-doped part of the FZ crystal. The solid line with the triangles reflects the density of the large defects, and the dashed line with the triangles the density of the small defects, respectively in the part of the FZ crystal not doped with oxygen.

This demonstrates that defects occurring in the high concentration close to the V/I boundary are neither BMD seeds nor a so-called "P-band", as has been described for example in R. Falster et al., Phys. Status Solidi B, Vol. 222, 2000, p. 219. Since the oxygen concentration of the oxygen-doped FZ silicon corresponds to that of CZ silicon, and since the same vacancy- and interstitial-rich regions occur in both crystals, the same conclusion can be drawn for CZ silicon.

Example

Figure 14:
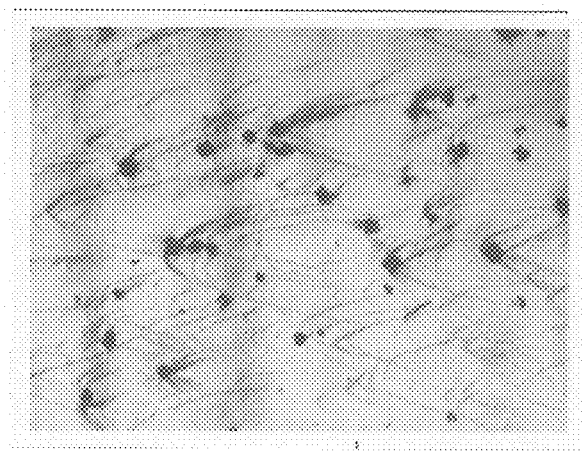
FIG. 14: Optical microscopy image (after copper decoration) of COP defects with a diameter <30 nm, which could not be detected by means of MO6 or the method according to U.S. Pat. No. 5,980,720.

A silicon single crystal was pulled according to the invention by means of the CZ method and cut into wafers according to the prior art. Four wafers at different rod positions were subjected to the heat treatment according to the prior art. Either these wafers revealed the described COP disk in the measurement with MO6, or they were COP disk-free and according to the Cu decoration technique revealed defects over the entire wafer or at least in zone of 80% of the radius, as measured from the wafer edge (FIG. 14). The heating rates for the heat treatment were selected as follows: 500-700° C.: 5 K/min; 700-900° C.: 4 K/min; 900-1000° C.: 3.5 K/min; 1000-1050° C.: 2 K/min; 1050-1100° C.: 1 K/min. The cooling rates corresponded to the heating rates indicated for the respective temperature ranges.

Figure 15:
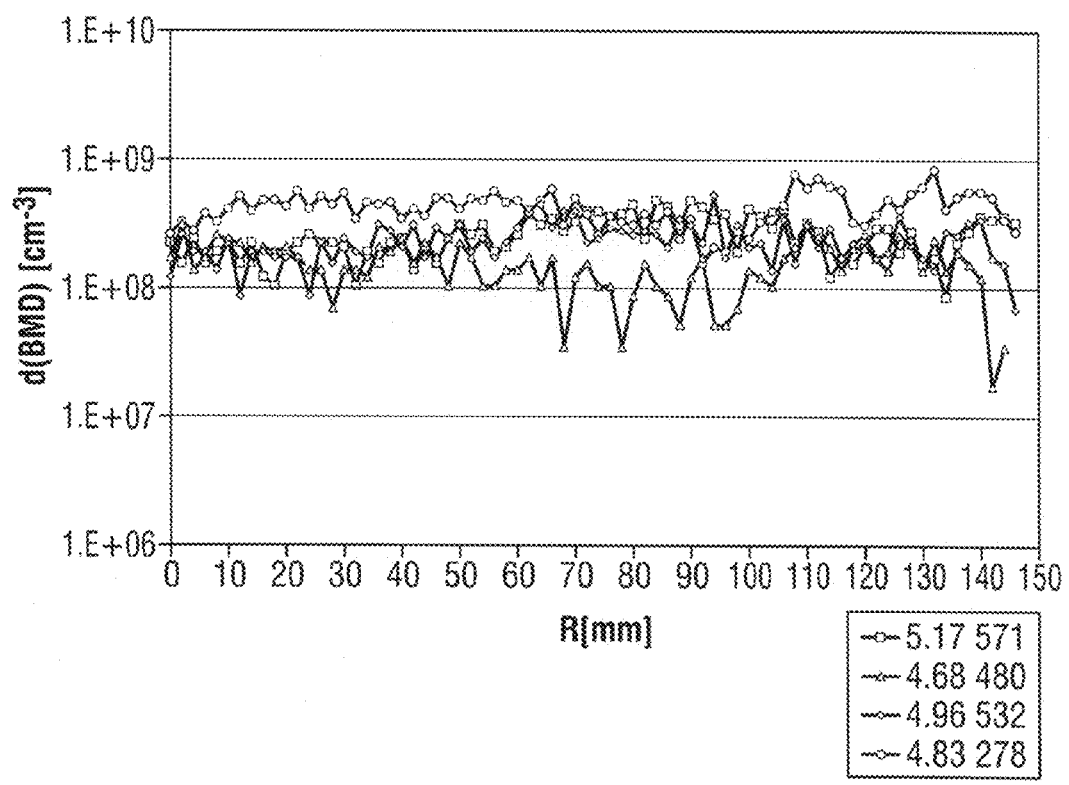
FIG. 15: Radial distribution of the BMD density, measured by SIRM, for four silicon wafers according to the invention.

FIG. 15 shows the result of a radial BMD measurement by means of SIRM. The left-hand value in the legend stands for the interstitial oxygen concentration [$O_i$] in the silicon wafer before the heat treatment, given in $10^{17}$ at/cm³ according to New ASTM. The right-hand value reflects the position of the silicon wafer inside the silicon rod (measured in millimeters from the start of the rod). The BMD density d(BMD) varies radially by less than a factor of 10. Owing to a lower BMD size sensitivity, an SIRM measurement reveals a BMD density d(BMD) lower than the BMD density d(BMD, C&E) determined by means of fracture, etching and optical microscopy. The correlation of the two methods was determined as d(BMD)/cm⁻³=1717·d(BMD, C&E)/cm⁻²+10⁴.

The radial BMD density d(BMD, C&E) after Secco treatment is row presented in FIG. 16, and was determined as $5·10^4$-$5·10^5$ cm⁻². The meaning of the legend is in FIG. 15.

Figure 17:
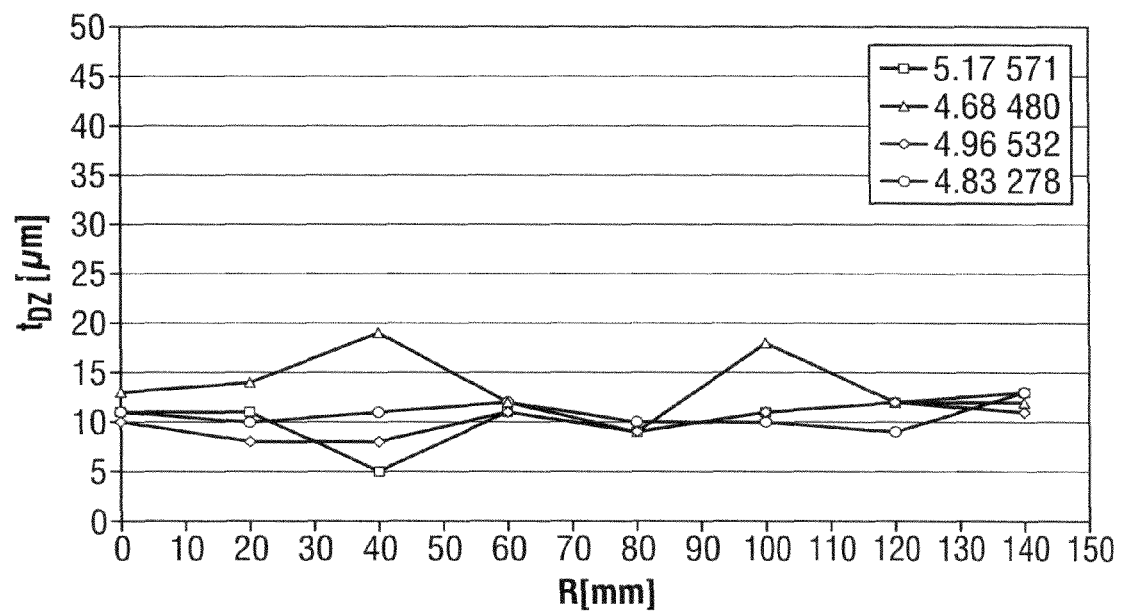
FIG. 17: Radial distribution of the depth of the BMD-free layer for four silicon wafers according to the invention.

The minimum thickness tDZ of the BMD-free layer (FIG. 17) was measured as described above and lies in the range of 5-18 μm for all the wafers. A typical getterability was determined as about 94% by driving in nickel impurity in the range of $2·10^{12}$ cm⁻². (Meaning of the legend as in FIG. 15.)

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A silicon wafer, in the entire volume of which crystal lattice vacancies represent the prevalent point defect type, the silicon wafer having a region which is rotationally symmetric with respect to its axis and has a width of at least 80% of the radius of the silicon wafer, this region comprising agglomerates of crystal lattice vacancies with a size of at least 30 nm in a density of at most 6 $10^3$ cm⁻³ and agglomerates of crystal lattice vacancies with a size of from 10 nm to 30 nm in a density of from $1·10^5$ cm⁻³ to $3·10^7$ cm⁻³, the silicon wafer comprising OSF seeds in a density of from 0 to 10 cm⁻² and an average BMD density in its interior of from $5·10^4$ cm⁻² to $5·10^5$ cm⁻², the BMD density varying at most by a factor of 10 in the radial direction over the entire radius of the silicon wafer, and wherein the silicon wafer comprises a BMD-free denuded zone layer at least on a front side of the silicon wafer, which is distinguished in that the first BMD on the entire front side of the silicon wafer is found at a depth of at least 5 μm and the first BMD is found on average at a depth of at least 8 μm.

2. The silicon wafer of claim 1, which is not doped with nitrogen.

3. The silicon wafer claim 1, wherein the total length of slips existing in the silicon wafer does not exceed 1 cm.

4. The silicon wafer of claim 1, wherein the rotationally symmetric region covers the entire surface of the silicon wafer.

5. The silicon wafer claim 1, comprising an OSF seed density of from 0 to 2 cm⁻².

6. The silicon wafer of claim 1, comprising an interstitial oxygen concentration [$O_i$] in the range of from $4.2·10^{17}$ cm⁻³ to $5.5·10^{17}$ cm⁻³.

7. The silicon wafer of claim 6, comprising an interstitial oxygen concentration [$O_i$] in the range of from $4.2·10^{17}$ cm⁻³ to $5.2·10^{17}$ cm⁻³.

8. A method for producing a silicon wafer of claim 1, comprising the following steps:
   a) preparing a silicon wafer having an interstitial oxygen concentration [$O_i$] in the range of from $4.5·10^{17}$ cm⁻³ to $5.8·10^{17}$ cm⁻³, in the entire volume of which crystal lattice vacancies represent the prevalent point defect type, the silicon wafer having a region which is rotationally symmetric with respect to its axis and has a width of at least 80% of the radius of the silicon wafer, this region comprising agglomerates of crystal lattice vacancies with a size of at least 30 nm in a density of at most $6·10^3$ cm⁻³ and agglomerates of crystal lattice vacancies with a size of from 10 nm to 30 nm in a density of from $1·10^5$ cm⁻³ to $3·10^7$ cm⁻³,
   b) heat treating the silicon wafer in an inert or reducing atmosphere, wherein the silicon wafer is heated starting from a loading temperature of from 350° C. to 750° C. with a heating rate of 0.5 K/min to 8 K/min to a temperature of 1000° C., and further with a heating rate of from 0.1 K/min to 4 K/min until a holding temperature in the range of from 1025° C. to 1175° C. is reached, is subsequently kept at the holding temperature for a duration of from 1 hour to 4 hours, and is then cooled to an unloading temperature wherein the silicon wafer thus produced, in the entire volume of which crystal lattice vacancies represent the prevalent point defect type, the silicon wafer having a region which is rotationally symmetric with respect to its axis and has a width of at least 80% of the radius of the silicon wafer, this region comprising agglomerates of crystal lattice vacancies with a size of at least 30 nm in a density of at most $6 \cdot 10^3$ cm$^{-3}$ and agglomerates of crystal lattice vacancies with a size of from 10 nm to 30 nm in a density of from $1 \cdot 10^5$ cm$^{-3}$ to $3 \cdot 10^7$ cm$^{-3}$, the silicon wafer comprising OSF seeds in a density of from 0 to 10 cm$^{-2}$ and an average BMD density in its interior of from $5 \cdot 10^4$ cm$^{-2}$ to $5 \cdot 10^5$ cm$^{-2}$, the BMD density varying at most by a factor of 10 in the radial direction over the entire radius of the silicon wafer, and wherein the silicon wafer comprises a BMD-free denuded zone layer at least on a front side of the silicon wafer, which is distinguished in that the first BMD on the entire front side of the silicon wafer is found at a depth of at least 5 μm and the first BMD is found on average at a depth of at least 8 μm.

9. The method of claim 8, wherein the silicon wafer is not doped with nitrogen.

10. The method of claim 8, wherein the silicon wafer has an interstitial oxygen concentration [$O_i$] in the range of from $4.5 \cdot 10^{17}$ cm$^{-3}$ to $5.5 \cdot 10^{17}$ cm$^{-3}$ before heat treatment.

11. The method of claim 8, wherein the heating rate is from 0.5 K/min to 5 K/min in the temperature range up to at most 1000° C.

12. The method of claim 8, wherein the holding temperature is in the range of from 1025° C. to 1125° C.

13. The method of claim 12, wherein the holding temperature is in the range of from 1050° C. to 1100° C.

14. The method of claim 8, wherein the silicon wafer is kept at the holding temperature for a duration of from 2 hours to 3 hours.

15. The method of claim 8, wherein the claimed heat treatment is the sole heat treatment.

16. The method of claim 8, wherein the heat treatment is carried out simultaneously on a multiplicity of silicon wafers in a batch oven.

* * * * *